(12) United States Patent
Everson et al.

(10) Patent No.: US 7,753,688 B1
(45) Date of Patent: Jul. 13, 2010

(54) BOARD CO-EDGE COUPLING WITH CONDUCTIVE ELEMENTS

(75) Inventors: Dennis D. Everson, Banks, OR (US); Christopher Shelsky, Nashua, NH (US)

(73) Assignee: Nexus Technology, Nashua, NH (US)

( * ) Notice: Subject to any disclaimer, the term of this patent is extended or adjusted under 35 U.S.C. 154(b) by 0 days.

(21) Appl. No.: 12/510,961

(22) Filed: Jul. 28, 2009

(51) Int. Cl.
*H01R 12/00* (2006.01)
(52) U.S. Cl. .......................................... 439/61
(58) Field of Classification Search .................... 439/61, 439/65, 66, 62, 631, 267; 361/785
See application file for complete search history.

(56) References Cited

U.S. PATENT DOCUMENTS

| | | | |
|---|---|---|---|
| 6,176,734 B1 * | 1/2001 | Juntwait et al. ............. | 439/493 |
| 6,322,382 B1 * | 11/2001 | Viallet ......................... | 439/248 |
| 6,997,720 B2 * | 2/2006 | Perret et al. .................... | 439/67 |
| 7,252,520 B1 * | 8/2007 | Millard et al. ................. | 439/77 |
| 2009/0298304 A1 * | 12/2009 | Brunker et al. ................. | 439/61 |
| 2009/0325395 A1 * | 12/2009 | Fan et al. ....................... | 439/61 |

* cited by examiner

*Primary Examiner*—Chandrika Prasad
(74) *Attorney, Agent, or Firm*—PatentForge

(57) ABSTRACT

A bridge connector assembly may provide access to signals of a circuit that includes an integrated circuit. The bridge connector assembly may include first and second circuit boards that are mated edge to edge, structural members that maintain the position of each circuit board in relation to each other and connectors to carry signals from edge connectors on one board to corresponding connectors on the second board.

14 Claims, 6 Drawing Sheets

Section AA

Section AA

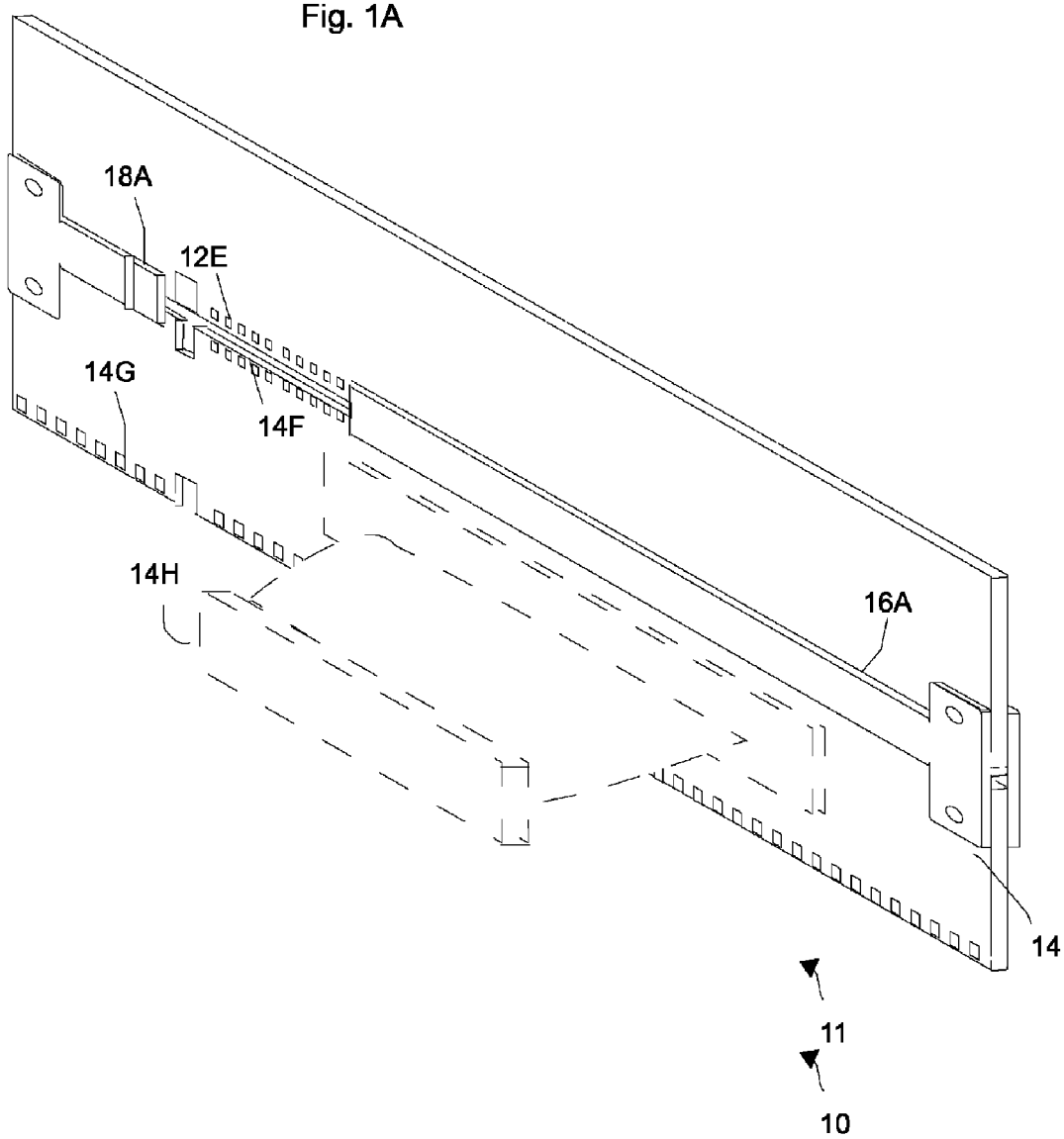

Section BB

Fig. 4          Section AA

BOARD CO-EDGE COUPLING WITH CONDUCTIVE ELEMENTS

BACKGROUND

The present disclosure relates generally to assemblies for electronic testing and more specifically to test assemblies with connectors and associated with circuit board mounted sockets for monitoring integrated circuit signals.

Examples of assemblies with connectors are found in the following U.S. Pat. Nos. 3,771,100; 4,220,382; 4,400,049 and 6,594,152. The disclosures of these references are hereby incorporated by reference in their entirety for all purposes.

SUMMARY

Integrated circuits operate using binary logic and transmit analog signals over lines that may incorporate pads, contacts, bond wires, traces and/or leads to other integrated circuits. Integrated circuits function at high speeds with multiple simultaneous and complex signals.

Integrated circuit functions are typically characterized by a logic analyzer which connects to the integrated circuit signal lines and simultaneously digitizes each analog signal from each signal line. The analyzer then statically displays the signals in a manner that allows the operator to see the functions and dependencies between the individual signals. Signal analysis may be done as the integrated circuit operates with other integrated circuits on a circuit board. Especially with integrated circuits that connect to the circuit board through a mounting configuration such as a memory socket, it may difficult to physically access the signal lines. Accessing the signal lines at a trace with a probe may also introduce parasitics such as inductance and capacitance associated with the probe that degrade the signal.

Alternatively, integrated circuit functions may be monitored using an oscilloscope. An oscilloscope may function in a similar manner as a logic analyzer to provide a static display of a repeating waveform. The oscilloscope may use probes to contact portions of leads, traces or pads and may have similar difficulties in accessing a signal line.

This disclosure describes an assembly that provides access to integrated circuit signals generated during operation in conjunction with a circuit board. The assembly may include a first and second circuit boards, first and second connector elements and first and second stays. When assembled the two circuit boards may be in coplanar positions with edges of the boards butted against each other or with edges proximate to each other.

This document may describe a bridge connector assembly for conducting discrete signals. The assembly may comprise a first circuit board with a front side and a back side and a first edge where the first edge includes a first set of plated pads on the front side and a second set of plated pads on the back side corresponding to the first set of plated pads. The assembly may also include a second circuit board with a front side and a back side, a first edge, a second edge opposite the first edge, a third set of plated pads at the first edge of the second circuit board on the front side, a fourth set of plated pads at the first edge of the second circuit board on the back side correlating in position to the third set of plated pads, a fifth set of plated pads at the second edge of the circuit board on the front side, a sixth set of plated pads at the second edge of the circuit board on the back side correlating in position to the fifth set of plated pads.

The assembly may further include a first connector element bridging the first and third set of plated pads to conduct a first set of discrete signals and a second connector element, separate from the first connector element, bridging the second and fourth set of plated pads to conduct a second set of discrete signals where with the first board in a coplanar position with the second board and the first edge of the first board proximate to the first edge of the second board, the first set of contacts correlate in position to the third plated pads and the second set of pads correlate in position to the fourth set of pads.

This document may also describe a connector for carrying a first set of discrete signals and a second set of discrete signals between a first circuit board and a second circuit board. The connector may comprise a first connector element configured to conduct the first set of discrete signal between the first and second circuit boards with a set of discrete conductive elements and a first housing assembled to a first side of the first board and a first side of the second board and configured to accept the first connector element. The connector may further comprise a second connector element separate from the first connector element configured to conduct the second set of discrete signals between the first and second circuit boards with a set of discrete conductive elements and a second housing assembled to a second side of the first board and a second side of the second board and configured to accept the second connector element.

The connector may also include retention means to restrict movement between the first circuit board, the second circuit board, the first connector element, the second connector element, the first housing and the second housing.

The connecting elements may be configured to introduce minimal signal degradation. The assembly may be mated to a DIMM socket that would normally accept a memory module. The assembly may include memory storage ICs to function as memory modules.

The assembly may be further configured to output signals to a signal or logic analyzer. A cable may be terminated on the second circuit board and may route signals associated with each card edge contact on the board so that signals can be monitored simultaneously.

While the term plated pad, card edge contact or contacts may be used in this description as examples for illustration, these terms may encompass any non-soldered separable electrical connection between two electrically conducting faces.

For the purposes of this disclosure the phrase "corresponding" or "correlating in position" in relation to sets of plated pads on opposite sides of a board will mean that a normal line from the plane of the face of a first plated pad will pass substantially through the center of a correlating pad on the opposite side of the board. And this will be true for each paired pad of the sets.

For coplanar sets of pads, "corresponding" or "correlating in position" will mean a plane exists through which the first set of plated pads will be mirrored to produced the second set of pads.

DESCRIPTION OF THE DRAWINGS

FIG. 1A is a perspective view of a bridge connector assembly.

DESCRIPTION

Figure 1:
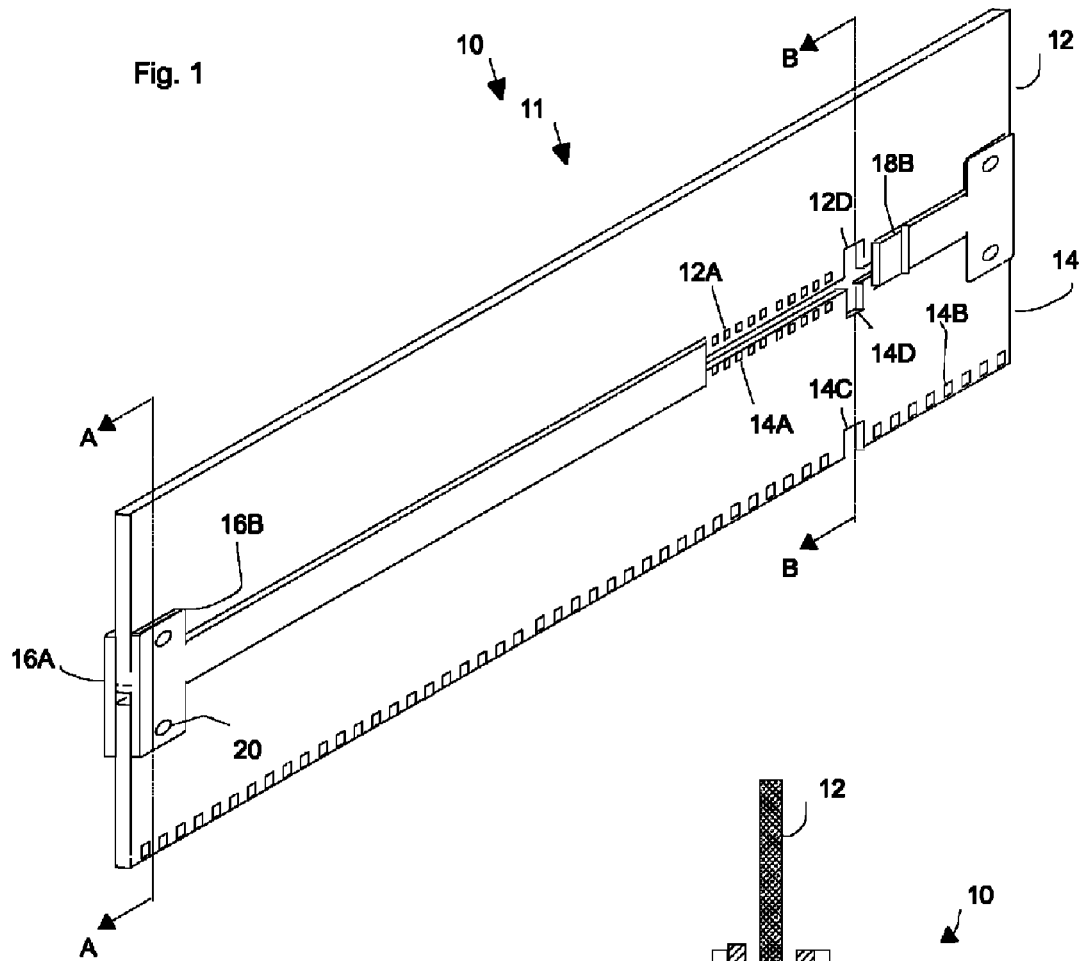
FIG. 1 is a perspective view of a bridge connector assembly.

FIG. 1 is a perspective view of a first or front side of bridge connector assembly 10 and includes a connector 11, a first circuit board 12 and a second circuit board 14 with socket slot 14C. Connector 11 may include a first stay 16A, a second stay 16B, contacts 14B, and one or more retention means or fastener 20. A portion of second stay 16B has been removed to illustrate contacts 12A and orientation slot 12D of first circuit board 12 and contacts 14A and orientation slot 14D of second circuit board 14 and first connector element 18B. An edge of first circuit board 12 and an edge of second circuit board 14 are proximate to each other and circuit board 12 and circuit board 14 are substantially coplanar.

First circuit board 12 and second circuit board 14 may be configured with a one to one physical correlation of first circuit board contacts 14A and second circuit board contacts 12A. Each contact 14A may correlate in position to each contact 12A on assembly. Connector element 18A may carry signals between corresponding contacts of first circuit board contacts 14A and second circuit board contacts 12A. Connector element 18A may include a plurality of discrete signal paths correlating in position to discrete circuit board contacts or plated pads of sets of contacts 12A and 14A.

First circuit board 12 may be a Dual In-line Memory Module (DIMM) as is standard for use in desktop and laptop computers generally mounted in a socket. Dual In-line Memory Modules and Dual In-line Memory Module sockets are well known to those skilled in the art. Second board 14 may be an interposer and may provide access to traces and signal lines carrying signals between a main board and first circuit board 12.

First stay 16A and second stay 16B with retention means 20 may hold first circuit board 12 and second circuit board 14 in substantially coplanar positions and may prevent movement of first circuit board 12 and second circuit board 14 in relation to each other. First stay 16A and second stay 16B may have yielding means or spring properties that exert a normal force substantially evenly along the length of connector elements 18A and 18B. First stay 16A and second stay 16B may contain or hold in position connector elements 18A and 18B against contacts of circuit boards 12 and 14.

FIG. 1A shows a second side or back side of first circuit board 12 and second circuit board 14. The second side of first circuit board 12 includes a set of plated pads 12E that correlate in position to plated pads or card edge contacts 12A on the opposite side of the board.

The second side of second circuit board 14 includes a set of plated pads 14F on a first edge of second circuit board that correlate in position to plated pads or card edge contacts 14A. The second side of second circuit board 14 also includes a set of plated pads 14G on a second edge opposite the first edge that correlate in position to plated pads or card edge contacts 14B on the opposite side of the circuit board. FIG. 1A also shows first stay 16A. First stay 16A may be assembled to assembly 10 and may retain connector element 18A against contacts 12E and 14F of circuit boards 12 and 14.

Second circuit board 14 may further include a conductive means for operably connecting to a cable or flex circuit represented by a dotted line figure at 14H. Cable or flex circuit 14H may carry signals from signal carrying lines or traces on second circuit board 14 to external equipment such as a logic or signal analyzer. Cable or flex circuit 14H may be incorporated into assembly 10 so that assembly 10 provides strain relief on the cable or flex circuit.

Figure 2:
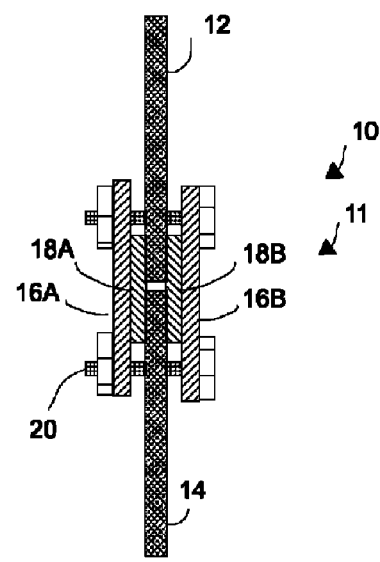
FIG. 2 is a cross section of the bridge connector assembly at an end section.

FIG. 2 shows a cross section AA as noted on assembly 10 of FIG. 1. Assembly 10 again includes connector 11, first circuit board 12 and second circuit board 14. Connector 11 may include first stay 16A, second stay 16B, first connector element 18A, second connector element 18B and retention means or fastener 20.

First stay 16A and second stay 16B are shown mounted to circuit boards 12 and 14. First connector element 18A is shown positioned between first stay 16A and first face of first circuit board 12 and second circuit board 14. Similarly, second connector element 18B is shown positioned between second stay 16B and second face of first circuit board 12 and second circuit board 14.

First connector element 18A and second connector element 18B may be configured to carry signals between the plated pad or card edge contacts 12A of first circuit board 12 and the plated pad or card edge contacts 14A of second circuit board 14. Connector elements 18A and 18B may include button contacts, spring contacts, elastomer contacts, fuzz buttons consisting of a compacted mass of fine wires or any other configuration that will conduct a set of discrete signals between proximate and substantially coplanar contact faces or pads.

First stay 16A may be connected to stay 16B by fastener 20. Fastener 20 may be a bolt and nut and may exert a force on both stay 16A and 16B creating a normal force applied to connector elements 18A and 18B pressing them against the contacts of circuit boards 12 and 14. Adequate normal force may be critical for maintaining reliable electrical and signal connections. Assembly 10 is shown with four fasteners 20 but other configurations may be used with different numbers of fasteners 20 and in different positions.

Figure 3:
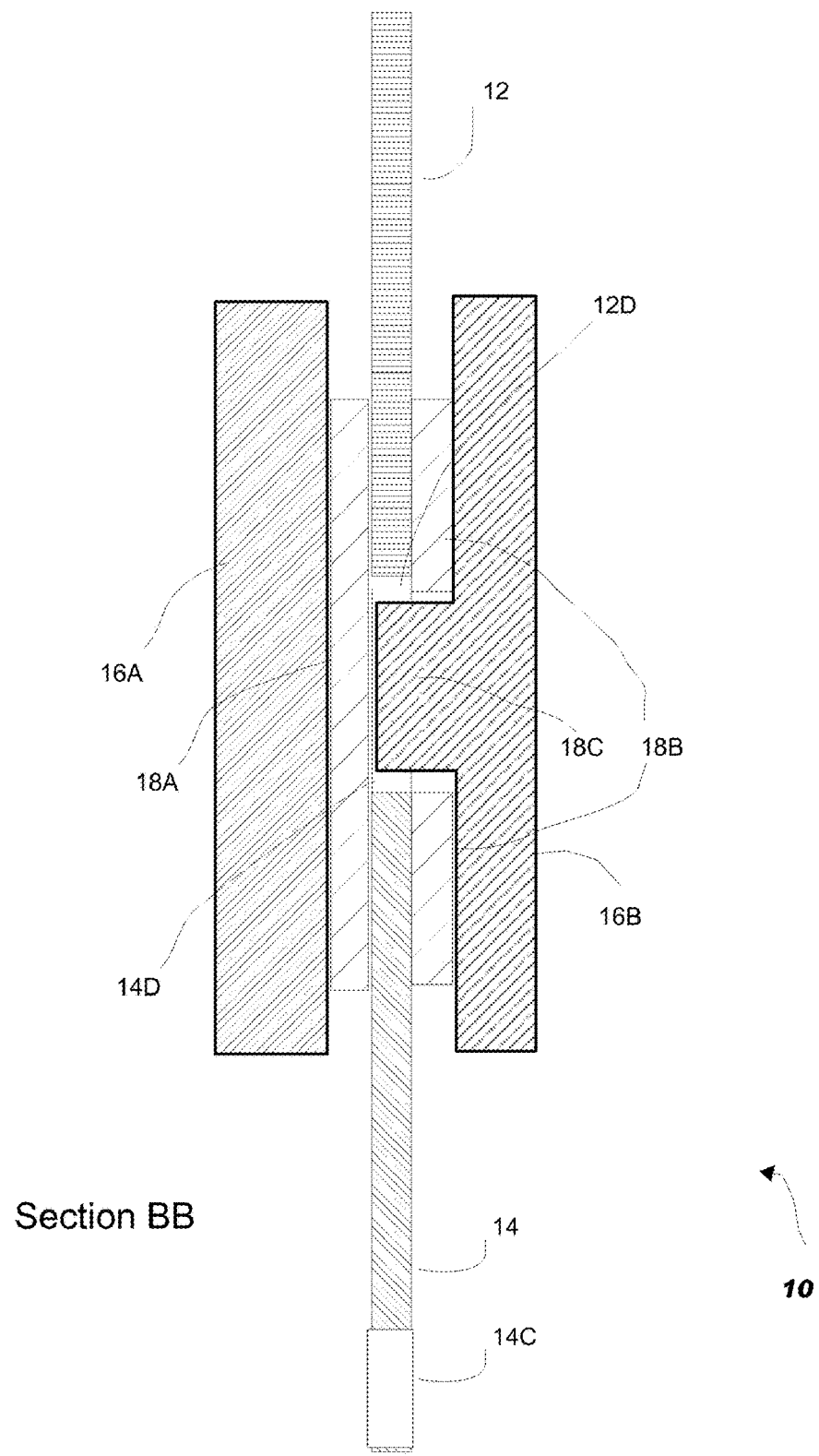
FIG. 3 is a cross section of the bridge connector assembly at a midpoint showing an orientation lug.

FIG. 3 shows a cross section BB as noted on assembly 10 in FIG. 1. Assembly 10 again includes connector 11, first circuit board 12, second circuit board 14 with socket slot 14D. Connector 11 may include, first stay 16A, second stay 16B, first connector element 18A and second connector element 18B. Cross section BB is at a portion of assembly 10 that includes orientation features. First circuit board 12 and second circuit board 14 may have discontinuous edges that form slots 12D and 14D. Slots 12D and 14D may serve to orient the board with other assembly components or in relation to the other circuit board. Stay 16A and/or 16B may include one or more keys, pins or lugs 18C that correspond to slots 12D and 14D to orient the stays in relation to circuit boards 12 and 14. Lug 18C and slots 12D and 14D may be configured so adjacent slots 12D and 14D accept lug 18C on assembly. This configuration may ensure first circuit board 12 and second circuit board 14 are oriented correctly.

Figure 4:
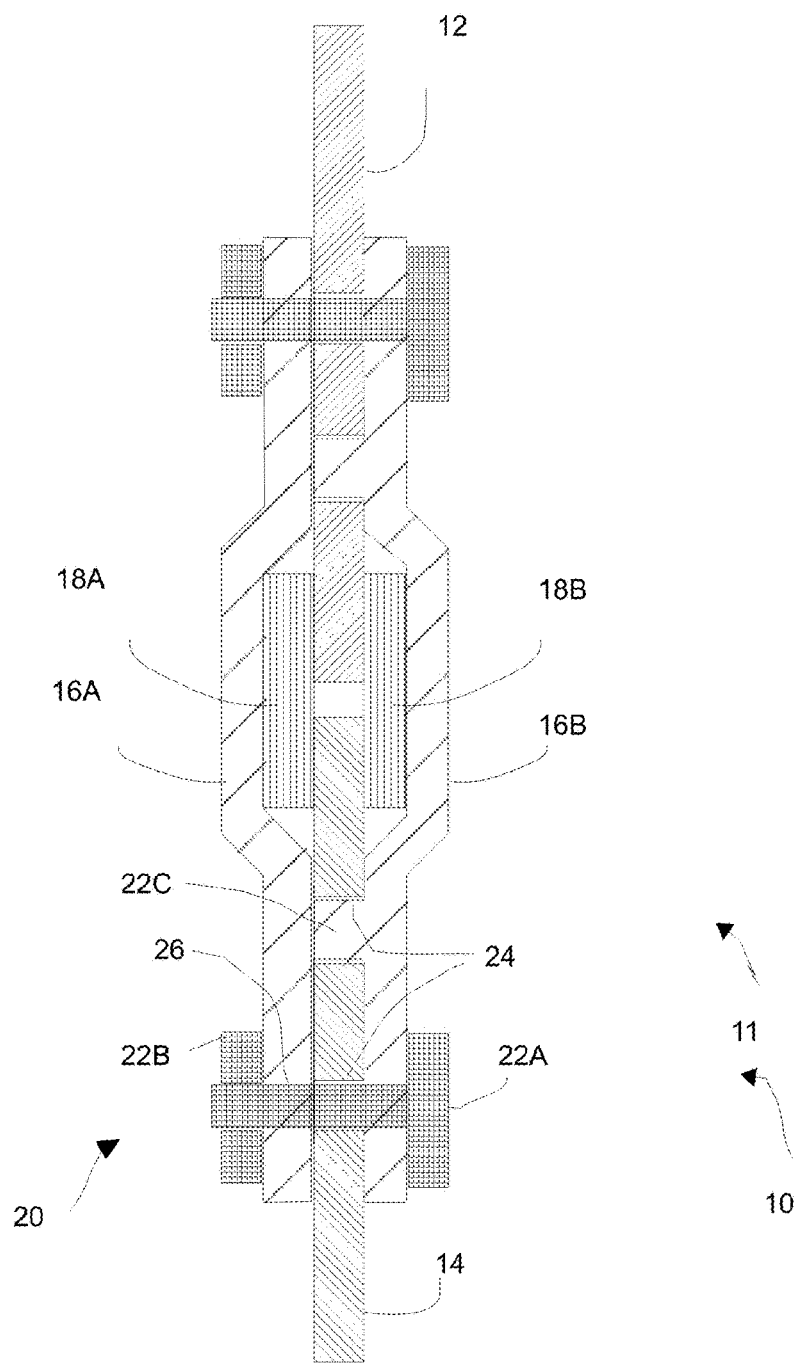
FIG. 4 is a cross section of the bridge connector assembly at an end section.

FIG. 4 shows an alternative configuration for a bridge connector assembly 10 as a cross section AA through assembly 10. Assembly 10 again includes connector 11, first circuit board 12 and second circuit board 14. Connector 11 may include first stay 16A, second stay 16B, first connector element 18A, second connector element 18B and retention means or fastener 20, Here first stay 16A and second stay 16B conform to connector elements 18A and 18B. First stay 16A also includes one or more pins 22C that fit into one or more corresponding holes 24 in circuit boards 12 and/or 14 to provide a positive orientation and retention system for circuit boards 12 and 14. Pin 22 may be longer than shown and may pass through second stay 16B as well.

Retention means 20 may be assembled to test assembly 10 such that it passes through holes 26 in first stay 16A and second stay 16B and also passes through hole 24 of circuit board 14. Retention means 20 may include a longitudinal structural member 22A and a separate fastener portion 22B. Longitudinal structural member 22A of retention means 20 may have a proximal end and a distal end. Longitudinal structural member 22A may be retained in test assembly 10 by a head at a proximal end and may be further retained in test assembly 10 by a fastener portion 22B at a distal end. Fastener portion 22B with longitudinal structural member 22A may positively retain components of assembly 10 including first stay 16A and second stay 16B in position.

While retention means 20 is shown to include pins, keys and/or a bolt and nut in this and the balance of the examples, any retention means which functions in a similar manner is within the scope of this disclosure. Longitudinal structural member 22A may be a portion of stay 16A and may protrude through second stay 16B. The protruding portion may be deformed or melted to fix it in place. Alternatively. longitudinal structural member 22A and may be fixed in place by a solder joint.

Figure 5:
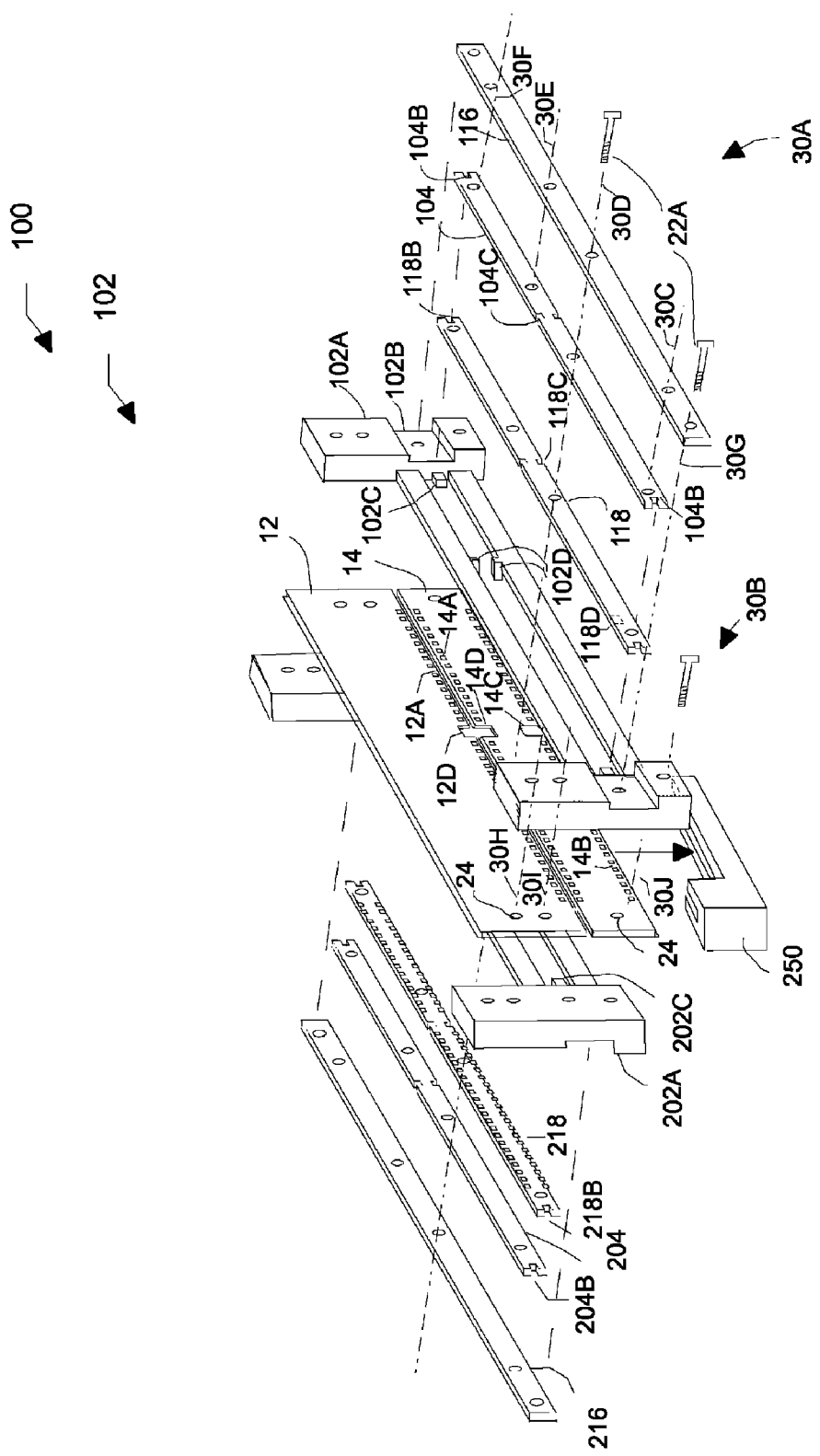
FIG. 5 is an exploded view of a bridge connector assembly.

FIG. 5 shows a bridge connector assembly 100 similar to test assembly 10. Similar numbering may be used here for features similar to features in previous figures. Bridge connector assembly 100 includes first circuit board 12, second circuit board 14, and connector 102. Connector 102 is shown with first bridge connector housing 102A and second bridge connector housing 202A, first spacer 104 and second spacer 204, first stay or stay element 116 and second stay or stay element 216 and first connector element 118 and second connector element 218.

First circuit board 12 is shown including orientation slot 12D, first set of edge contacts 12A and a plurality of orientation holes 24. Second circuit board 14 is shown including second orientation slot 14D, socket slot 14C, second set of edge contacts 14A, third set of edge contacts 14B and orientation holes 24.

Connector body 102A may include left and right recesses 102B in connector body 102A, top and bottom first orientation keys 102D and left and right second orientation keys 102C. Top and bottom first orientation keys 102D may work with orientation slots 12D and 14D in a similar manner to lug 18C to maintain orientation of assembly components. First bridge connector housing 102A and associated second bridge connector housing 202A may perform similar functions, at least in part, as first stay 16A and second stay 16B.

Spacer 104 may include left and right first orientation slots 104B and top and bottom second orientation slots 104C. Connector element 118 may include left and right first orientation slots 118B and top and bottom second orientation slots 118C. Connector element 118 may further include a set of bridge contacts or discrete conductive elements 118D not visible on a first or mating side of connector element 118 represented by a dotted line box. First connector body 102A and second connector body 202A, first spacer 104 and second spacer 204, first stay element 116 and second stay element 216 and first connector element 118 and second connector element 218 may all include aligned sets of holes used in conjunction with retention means 20.

Second connector housing 202A, second spacer 204, second stay element 216 and second connector element 218 may be corresponding components to first connector housing 102A, first spacer 104, first stay element 116 and first connector element 118 with configurations substantially mirrored across the plane of first circuit board 12 with corresponding slots and keys such as left and right connector body key 202C, left and right spacer key 204B and left and right connector key 218B. First connector housing 102A may accept first connector element 118 and second connector housing 202A may accept second connector element 218.

In alternative configuration top and bottom keys 102D may be located on one connector body and not the other. Alternatively, a top key may be on one connector body and a bottom key may be on the other connector body. Alternatively, connector bodies 102A and 202A may have only left and right keys 102C. Any configuration of keys, slots and notches which perform a similar function will fall within the scope of this disclosure.

First connector body 102A may be assembled to a first side of first circuit board 12 and a first side of second circuit board 14. Top and bottom keys 102D may rest in aligned slot 12D of first circuit board 12 and slot 14D of second circuit board 14.

First connector element 118 may be assembled to the first side of first circuit board 12 and second circuit board 14 with connector element contacts 118D bridging and connecting first circuit board contacts 12A and second circuit board contacts 14A to conduct discrete signals between correlating pairs of plated pads. Top and bottom keys 102D of connector body 102A may sit in top and bottom slots 118C of connector element 118. Left and right keys 102C of connector body 102A may sit in left and right slots 118B. Keys and slots may serve to align connector element 118 with circuit board contacts.

Spacer 104 may be assembled to rest against a second side of connector element 118. Keys 102C and 102D may similarly rest in slots 104B and 104C of spacer 104. Stay element 116 may be assembled to rest against spacer 104 and seat into connector body recess 102B.

Second connector 202, second spacer 204, second stay element 116 and second connector element 218 may be similarly assembled to a second side of first circuit board 12 and second circuit board 14. Some features of second connector 202, second spacer 204, second stay element 116 and second connector element 218 have not been noted here as they mirror their matching components.

Connector system 100 may include retention means 20 as described at least in part in FIG. 4. Retention means 20 may also serve as an orientation means for components of assembly 100. An orientation means may ensure that components can be assembled in only one way and/or maintain components in a substantially exact position during assembly.

Retention means 20 may again comprise pins, slots, holes, screws and/or nuts and bolts. Retention means 20 may combine features in any of a number of configurations but may serve to provide orientation for certain components, and prevent movement of first circuit board 12, second circuit board 14 and connector element 118 and 218 in relation to each other. Retention means 20 in this example may include contact retention means 30A and circuit board retention means 30B. Contact retention means 30A and circuit board retention means 30B may overlap in part and may not be completely separate with some components serving both.

Contact retention means 30A is shown in one example configuration in FIG. 5 as a first set of aligned holes of retention means subsets 30C, 30D, 30E and 30F. Aligned holes of subset 30D passes through holes of first stay element 116 and second stay element 216, first spacer 104, second spacer 204, first bridge connector element 118 and second connector element 218. When assembled, holes of contact retention means subset 30D will be aligned. Subset 30D may include a bolt 22A that may pass through holes of subset 30D and be secured by nut 22B which when secured applies a normal force between the components. Longitudinal structural member 22A may pass between edges of first circuit board 12 and second circuit board 14.

Aligned holes of retention means subsets 30C, 30E and 30F may be similarly configured but offset in regular steps along the longitudinal axis of each component to apply a substantially even normal force along the length of connector element 118.

Circuit board retention means 30B in this example is aligned orthogonally to retention means 30A. Retention means 30B may again include any of numerous combinations of pins, holes, slots, screws and/or nuts and bolts configured to at least in part maintain alignment of components and prevent movement of first circuit board 12, second circuit board 14 and connector element 118 and 218 in relation to each other. As an example, circuit board retention means 30B is shown in FIG. 5 as sets of holes of retention means subsets 30G, 30H, 30I and 30J in connector bodies 102A, second connector body 202A, first circuit board 12 and second circuit board 14 together with bolt 22A for each set. Bolt 22A may pass through each hole set and with nut 22B applying force along the member's longitudinal axis to hold components securely in place.

Alternatively, longitudinal structural member 22A may be a screw that sets threads in the softer material of second connector body 202A. Alternatively, longitudinal structural member 22A may be a pin 22C that is an extension of connector body 102A and passes through first circuit board 12 or second circuit board 14 and second connector body 202A. Pin 22C may pass into second connector body 202A and act as an orienting feature. Pin 22C may pass through second connector body 202A completely and may be retained by deforming the pin similar to a rivet, affixing a retaining collar or other method.

Bridge connector assembly 100 may be configured to mate with a dimm socket 250 that may be mounted on a circuit board. Socket slot 14C may be configured to mate with a key in socket 250 to maintain proper orientation.

Assembly 100 may function at least in part as a Dual In-line Memory Module (Dimm) and may include integrated circuits as might be part of a dimm. Bridge connector assembly 100 may function to allow access to signals associated with memory function. First circuit board 12 may have contact counts of one selected from the group of 72, 100, 144, 168, 172, 184, 200, 204, 214 and 240 contacts. Contacts 12A would have 36, 50, 72, 84, 86, 92, 100, 102, 107 or 120 contacts respectively with an equal contact count on the opposite side of second circuit board 14. First and second connector elements 118 and 218 may also include discrete conductive element counts of 36, 50, 72, 84, 86, 92, 100, 102, 107 or 120.

Figure 6:
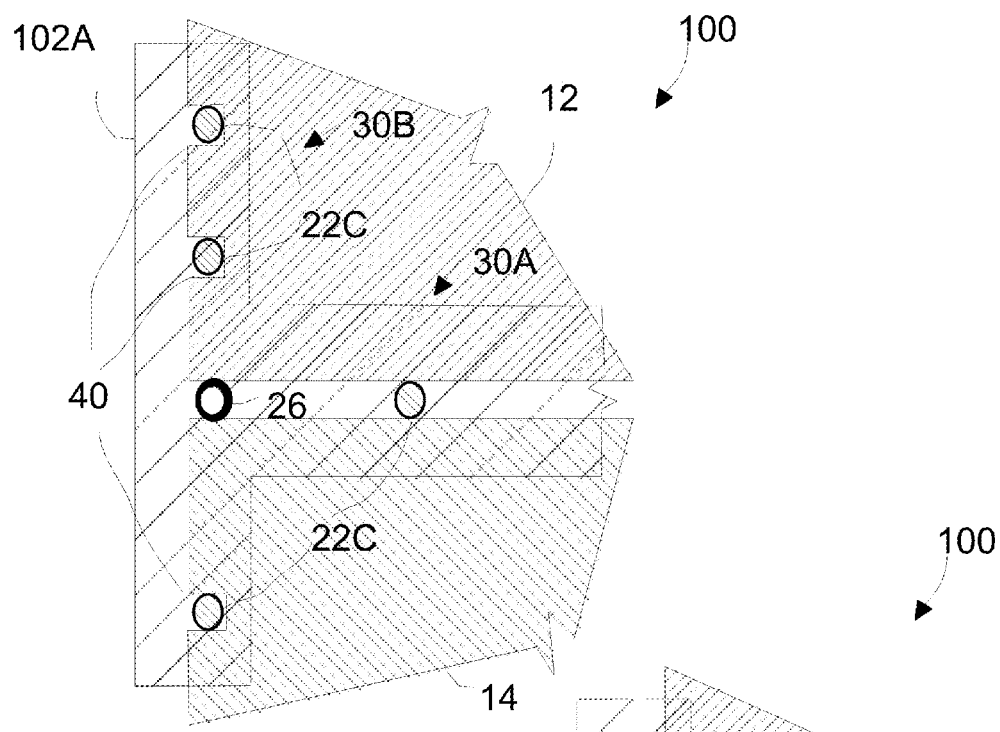
FIG. 6 is a front view of a portion of the bridge connector assembly with retention means showing orientation pins and screw holes.

FIG. 6 is a view of a portion of an assembly 100 similar to FIG. 5 showing an alternative example of retention means 20 used at least in part as orientation. Assembly 100 here includes first circuit board 12, second circuit board 14, first connector body 102A and retention means 20 as connector retention means 30A and circuit board retention means 30B. For clarity, other components of the assembly 100 are not shown. Connector body 102A in this example has three pins 22C positioned on the vertical axis and oriented out of the page and a hole 26. Connector body 102A has a fourth pin on the horizontal axis also oriented out of the page. First circuit board 12 and second circuit board 14 include slots 40 configured such that, on assembling first circuit board 12 and second circuit board 14 to connector body 102A, the three pins 22C on the vertical axis rest in the three slots 40. Both circuit boards butt against the fourth pin 22C with board edges proximate but separated by the diameter of pin 22C. Hole 26 in connector body 16A may accept accept bolt 22A.

Figure 7:
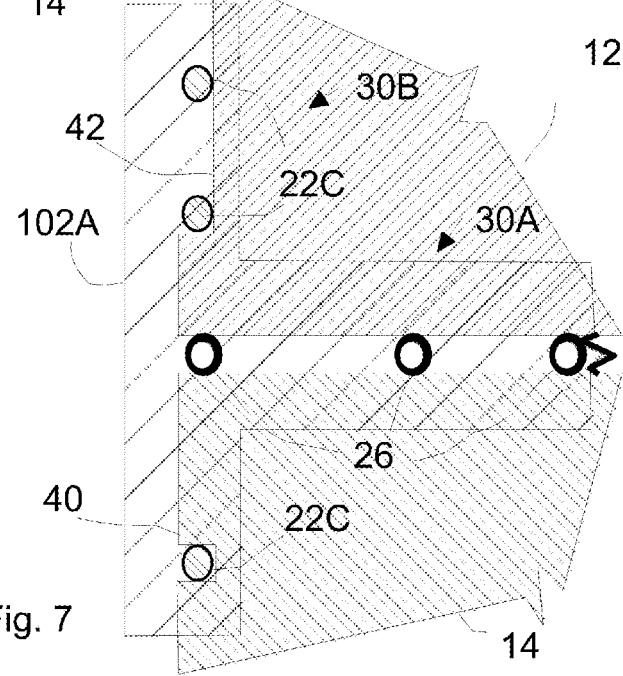
FIG. 7 is a front view of a portion of the bridge connector assembly with retention means showing orientation pins and screw holes.

FIG. 7 is another view of a portion of assembly 100 similar to FIG. 1 showing another alternative example of retention means 20 used at least in part as orientation. Assembly 100 again includes first circuit board 12, second circuit board 14, first connector body 102A and retention means or fastener 20 as contact retention means 30A and circuit board retention means 30B. Again, for clarity, other components of the assembly are not shown. Connector body 102A in this example has three pins 22C positioned on the vertical axis and oriented out of the page and three holes 26 positioned on the horizontal axis. Here first circuit board 12 has a cutout 42 along one edge. Second circuit board 14 includes a slot 40. Assembling first circuit board 12 and second circuit board 14 to connector body 102A one pin 22C on the vertical axis nests in slot 22 of circuit board 14. Two pins 22C rest on an edge in cutout 42 of circuit board 12. Both circuit boards butt against a bolt or other retention means assembled to holes 26. On assembly board edges may be proximate but separated by the diameter of bolt 22A of retention means 20.

Alternatively, first circuit board 12 and second circuit board 14 may butt against each other with no bolt 22A or pin 22C separating them.

The described system and assemblies are examples and are not to be used as limitations. The number of pins and pads or electrical contacts may be more or fewer than those shown. The sockets and boards may take on different configurations and shapes. Any suitable configuration or combination of components presented, or equivalents to them that perform a similar function, may also be used.

This disclosure may include one or more independent or interdependent inventions directed to various combinations of features, functions, elements and/or properties, one or more of which may be defined in the following claims. Other combinations and sub-combinations of features, functions, elements and/or properties may be claimed later in this or a related application. Such variations, whether they are directed to different combinations or directed to the same combinations, whether different, broader, narrower or equal in scope, are also regarded as included within the subject matter of the present disclosure. An appreciation of the availability or significance of claims not presently claimed may not be presently realized.

Accordingly, the foregoing embodiments are illustrative, and no single feature or element, or combination thereof, is essential to all possible combinations that may be claimed in this or a later application. Each claim defines an invention disclosed in the foregoing disclosure, but any one claim does not necessarily encompass all features or combinations that may be claimed. Where the claims recite "a" or "a first" element or the equivalent thereof, such claims include one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

We claim:

1. A bridge connector assembly for conducting discrete signals comprising:
    a first circuit board with a front side and a back side and a first edge where the first edge includes:
        a first set of plated pads on the front side; and
        a second set of plated pads on the back side corresponding to the first set of plated pads;

a second circuit board with:
  a front side and a back side;
  a first edge;
  a second edge opposite the first edge;
  a third set of plated pads at the first edge of the second circuit board on the front side;
  a fourth set of plated pads at the first edge of the second circuit board on the back side correlating in position to the third set of plated pads;
  a fifth set of plated pads at the second edge of the circuit board on the front side; and
  a sixth set of plated pads at the second edge of the circuit board on the back side correlating in position to the fifth set of plated pads;
a first connector element bridging the first and third set of plated pads to conduct a first set of discrete signals; and
a second connector element, separate from the first connector element, bridging the second and fourth set of plated pads to conduct a second set of discrete signals;
where with the first board in a coplanar position with the second board and the first edge of the first board proximate to the first edge of the second board:
  the first set of contacts correlate in position to the third plated pads; and
  the second set of pads correlate in position to the fourth set of pads.

2. The bridge connector assembly of claim 1 the second edge of the second board is configured to engage a dual in-line memory module socket.

3. The bridge connector assembly of claim 1 further including:
  a first stay to hold the first connector element to the front side of first circuit board and the front side of the second circuit board;
  a second stay to hold the second connector element to the back side of first circuit board and the back side of the second circuit board; and
  retention means preventing relative movement between the first stay, the second stay, the first circuit board, the second circuit board, the first connector element and the second connector element.

4. The bridge connector assembly of claim 1 where the first edge of the first board and the first edge of the first board include slots for orienting the first circuit board and the second circuit board in the bridge connector assembly.

5. The bridge connector assembly of claim 1 where the first set of plated pads includes a pad count selected from the group of 36, 50, 72, 84, 86, 92, 100, 102, 107 and 120.

6. The bridge connector assembly of claim 1 where the first connector element further include contacts of a type selected from the group of coil spring, elastomeric and fuzz button.

7. A connector for carrying a first set of discrete signals and a second set of discrete signals between a first circuit board and a second circuit board comprising:
  a first connector element configured to conduct the first set of discrete signal between the first and second circuit boards with a set of discrete conductive elements;
  a first housing assembled to a first side of the first board and a first side of the second board and configured to accept the first connector element;
  a second connector element separate from the first connector element configured to conduct the second set of discrete signals between the first and second circuit boards with a set of discrete conductive elements;
  a second housing assembled to a second side of the first board and a second side of the second board and configured to accept the second connector element; and
  retention means to restrict movement between the first circuit board, the second circuit board, the first connector element, the second connector element, the first housing and the second housing.

8. The connector of claim 7 where connector further includes:
  a first stay assembled to the first housing and the first connector element; and
  a second stay assembled to the second housing and the second connector element.

9. The connector of claim 7 where the first housing and the first connector element include a key and a slot and the key is positioned in the slot to orient the first connector element to the first housing.

10. The connector of claim 7 where the first circuit board includes a first slot and the second circuit board includes a second slot and the first housing includes a key positioned in the first slot and second slot.

11. The connector of claim 7 where the second circuit board second edge is configured to operably connect with a dimm socket.

12. The connector of claim 7 where the second circuit board further includes conductive means to source signals from the first circuit board to a logic analyzer separate from the assembly.

13. The connector of claim 7 where the first connector element includes a count of discrete conductive elements selected from the group of 36, 50, 72, 84, 86, 92, 100, 102, 107 and 120.

14. The connector of claim 7 where the discrete conductive element of the first connector element further includes contacts of a type selected from the group of coil spring, elastomeric and fuzz button.

* * * * *